United States Patent [19]

Sklebitz

[11] Patent Number: 5,563,414
[45] Date of Patent: Oct. 8, 1996

[54] X-RAY IMAGE SENSOR

[75] Inventor: Hartmut Sklebitz, Erlangen, Germany

[73] Assignee: Siemens Aktiengesellschaft, Munich, Germany

[21] Appl. No.: 542,910

[22] Filed: Oct. 13, 1995

[30] Foreign Application Priority Data

Nov. 3, 1994 [DE] Germany .......................... 44 39 260.5
Jan. 31, 1995 [DE] Germany .......................... 19503034 U

[51] Int. Cl.⁶ ..................................... G01T 1/20
[52] U.S. Cl. .................... 250/368; 250/367; 250/370.09; 250/370.11
[58] Field of Search ..................... 250/368, 367, 250/370.08, 370.09, 370.11; 378/62

[56] References Cited

U.S. PATENT DOCUMENTS

| | | | |
|---|---|---|---|
| 4,179,100 | 12/1979 | Sashin et al. | 250/370.09 |
| 4,755,681 | 7/1988 | Oka et al. | 250/370.01 |
| 5,081,346 | 1/1992 | Narabu et al. | 250/208.1 |
| 5,138,166 | 8/1992 | Makino et al. | 250/368 |
| 5,138,642 | 8/1992 | McCroskey et al. | |
| 5,391,879 | 2/1995 | Tran et al. | 250/367 |

FOREIGN PATENT DOCUMENTS 58-210582 12/1983 Japan ....................... 250/368

OTHER PUBLICATIONS

Abileah, Adi "Optical Tile Active Matrix LCD For Seamless Large Displays", Advanced Imaging pp. 20, 22, & 68, Jan. 1993.

*Primary Examiner*—Carolyn E. Fields
*Assistant Examiner*—Virgil Orlando Tyler
*Attorney, Agent, or Firm*—Hill, Steadman & Simpson

[57] ABSTRACT

An X-ray image sensor with electronic, planar image converters covers a relatively large area without the occurrence of image gaps. A number of image converters adjoin one another in a surface, these being coupled to a scintillator via fiber optics. At least a part of the fiber optics proceeds at an angle deviating from 90° relative to the image converters, such that the fiber optics adjoin one another at the scintillator but leave an area free at the image converters. This area is at the junction of two image converters that adjoin one another, and is thus an optically inactive region.

4 Claims, 2 Drawing Sheets

X-RAY IMAGE SENSOR

BACKGROUND OF THE INVENTION

1. Field of the Invention

The present invention is directed to an X-ray image sensor wherein incident X-rays are converted into optical signals and the optical signals are subsequently converted into corresponding electrical signals.

2. Description of the Prior Art

X-ray images can be produced by an X-ray image sensor having a planar electronic image converter (for example, a CCD) preceded by a scintillator functioning as a luminescent screen. The image converter is optically coupled to the scintillator and generates image signals from which an image of the examined region of a patient can be electronically generated. Image converters that can be currently realized, however, have limited dimensions, so that images of large subjects can be acquired only as a result of complicated structural design, especially of the fiber optics that conducts the light from the scintillator onto the image converter.

SUMMARY OF THE INVENTION

An object of the present invention is to provide an X-ray image sensor on the basis of electronic image converters such that a relatively large imaging area is created given a simple structural format.

The above object is achieved in accordance with the principles of the present invention in an X-ray image sensor having a number of planar image converters which adjoin each other at their edges, the edges of the image converters constituting optically inactive regions, the image converters being coupled to a scintillator via fiber optics, and the fiber optics being inclined relative to the image converters at an angle deviating from 90°. The fiber optics are thus adjacent each other at the scintillator, but leave an area free at the image converters at the junction of adjoining image converters. Because no fiber optics terminate at the optically inactive regions of the adjoining image converters, there are no gaps in the overall X-ray image produced by the X-ray image sensor.

The aforementioned "angle deviating from 90°" is measured relative to the surface normal of either the planar scintillator surface or the planar image converter surfaces.

In the inventive X-ray image sensor, for example, a number of CCD image converters adjoin one another. The optically inactive edge zones of the converters in which, for example, gate terminals and registers are disposed, cause no gaps in the X-ray image.

DESCRIPTION OF THE PREFERRED EMBODIMENTS

Figure 1:
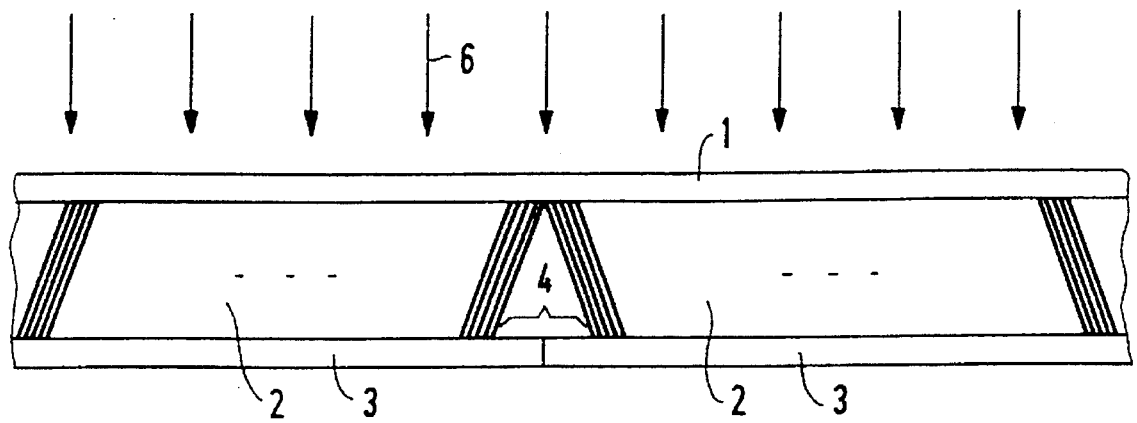
FIG. 1 is a schematic side view of a portion of an X-ray image sensor constructed in accordance with the principles of the present invention, in a first embodiment.

FIG. 1 shows a scintillator 1 that is optically coupled to image converters 3 via fiber optics 2. FIG. 1 shows that a number of image converters 3 adjoin one another in a plane. The image converters 3 respectively have optically inactive edge zones 4. To prevent any portion of the image from being lost as a result of these edge zones 4, the fiber optics 2 are inclined relative to the image converters 3 and the scintillator 1 by an angle deviating from 90°. The fiber optics 2 adjoin one another at the scintillator 1, i.e. acquire the entire image of the scintillator 1, but leave the edge zones 4 of the image converter 3 free.

The fiber optics 2 are composed of bundles of parallel fibers whose end faces are cut at an angle deviating from 90° relative to the fiber longitudinal axis. The fiber optics 2 are placed between the image converters 3 and the scintillator 1 such that they adjoin one another at the scintillator 1 but leave the edge zones 4 free, as permitted by the non-90° end cuts.

Figure 2:
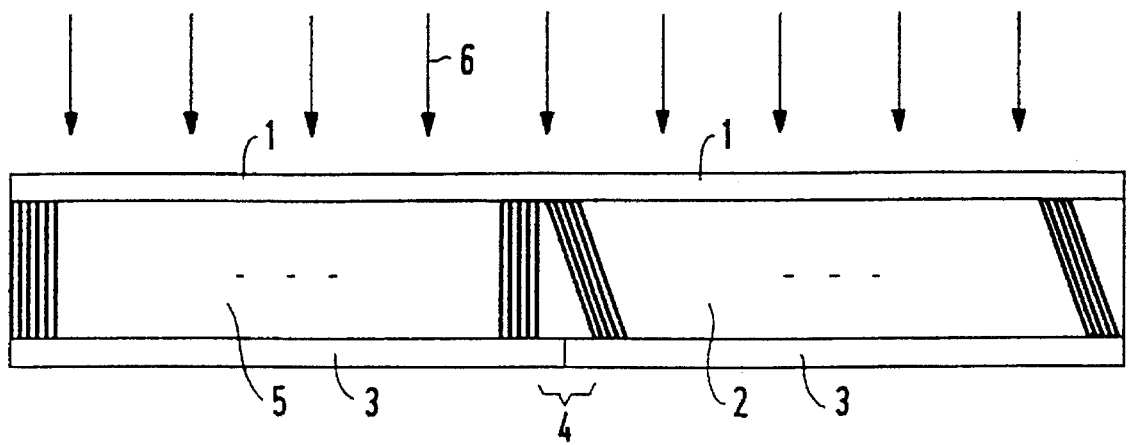
FIG. 2 is a schematic side view of a portion of an X-ray image sensor constructed in accordance with the principles of the present invention, in a second embodiment.

The arrows 6 represent the X-radiation incident on the scintillator 1. The fiber optics 2 also serve the purpose of shielding the image converters 3 from the X-radiation. The image converters 3 cover a relatively large image field, so that image of relatively large subjects can be picked-up. The image converters 3 can be arranged in a row but can also be arranged as a matrix of, for example, four image converters FIG. 2 shows an embodiment wherein the left fiber optics 2 in FIG. 1 is replaced by fiber optics 5 that proceeds perpendicularly to the image converters 3, i.e. lies at an angle of 90° relative to the image converter 3, by contrast to the fiber optics 2. In this embodiment as well the edge zones 4 of the image converters 3 are left free.

Figure 3:
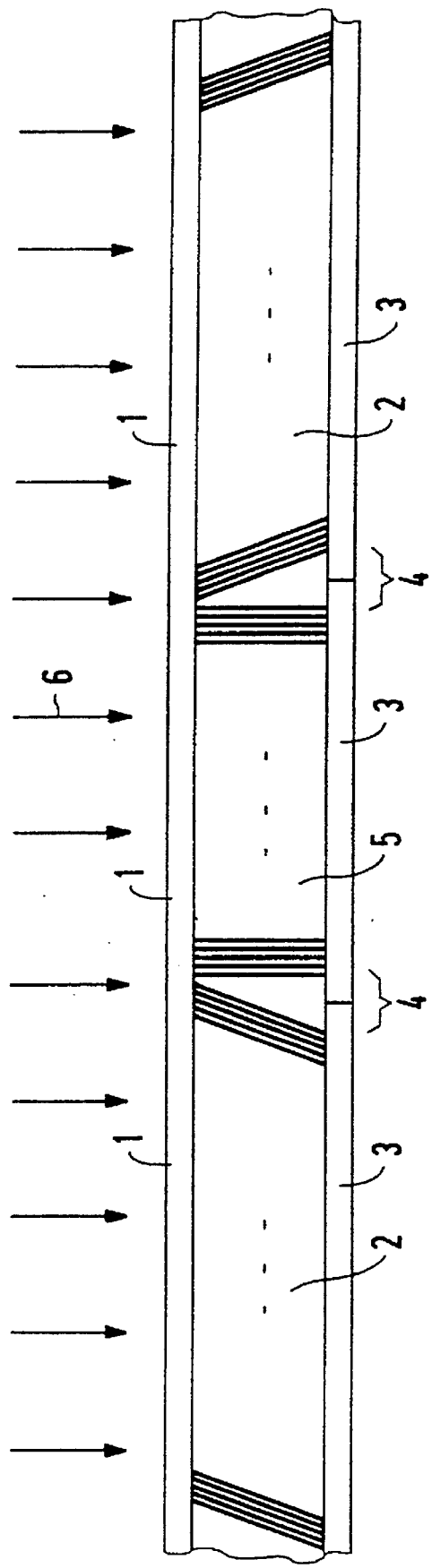
FIG. 3 is a schematic side view of a portion of an X-ray image sensor constructed in accordance with the principles of the present invention, in a third embodiment.

FIG. 3 shows an embodiment wherein three fiber optics 2, 5, 2 follow one another, corresponding to the sequence of three image converters 3.

An X-ray image sensor of the type disclosed herein is especially suitable for mammography.

Although modifications and changes may be suggested by those skilled in the art, it is the intention of the inventor to embody within the patent worded hereon all changes and modifications as reasonably and properly come within the scope of his contribution to the art.

I claim as my invention:

1. An X-ray image sensor comprising:

a plurality of planar CCD image converters each having at least one optically inactive edge region and said plurality of planar CCD image converters being arranged adjoining each other at their respective edge regions;

a scintillator which converts incident X-rays into corresponding optical signals, said scintillator having a surface normal; and a plurality of optical fibers extending between said scintillator and said planar CCD image converters and optically coupling said optical signals from said scintillator to said planar CCD image converters for conversion of said optical signals in said planar CCD image converters into electrical signals, at least some of said optical fibers being disposed at an angle deviating from said surface normal so that said optical fibers are adjacent each other at said scintillator but are separated at said planar CCD image converters and leaving an area substantially coinciding with adjoining edge regions of respective planar CCD image converters free of optical fibers.

2. An X-ray image sensor as claimed in claim 1 wherein said portion of said optical fibers disposed at an angle deviating from said surface normal comprise parallel optical fibers each having opposite ends cut at said angle deviating from said surface normal.

3. An X-ray image sensor as claimed in claim 1 wherein said plurality of planar image converters include first and second adjoining image converters, said optical fibers disposed in an angle deviating from said surface normal being extending between said scintillator and said first image converter, and said image sensor further comprising optical fibers extending between said scintillator and said second image converter which are disposed parallel to said surface normal.

4. An X-ray image sensor as claimed in claim 1 wherein said plurality of planar image converters includes first, second and third image converters, said first image converter adjoining said second image converter at a first side of said second image converter and said second image converter adjoining said third image converter at a second side of said second image converter, opposite said first side, said optical fibers disposed at an angle deviating from said surface normal extending between said scintillator and each of said first and third image converters, and further comprising optical fibers disposed parallel to said surface normal extending between said scintillator and said second image converter.

* * * * *